US009508867B2

(12) United States Patent
Li et al.

(10) Patent No.: US 9,508,867 B2
(45) Date of Patent: Nov. 29, 2016

(54) THIN FILM TRANSISTOR, ARRAY SUBSTRATE, METHOD OF FABRICATING SAME, AND DISPLAY DEVICE

(71) Applicant: Boe Technology Group Co., Ltd., Beijing (CN)

(72) Inventors: Dongsheng Li, Beijing (CN); Ning Chen, Beijing (CN); Xingdong Liu, Beijing (CN); Wei Guo, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/500,184

(22) Filed: Sep. 29, 2014

(65) Prior Publication Data
US 2015/0340512 A1 Nov. 26, 2015

(30) Foreign Application Priority Data

May 20, 2014 (CN) .......................... 2014 1 0213599

(51) Int. Cl.
*H01L 29/786* (2006.01)
*H01L 29/417* (2006.01)
*H01L 29/66* (2006.01)
*H01L 27/12* (2006.01)
*H01L 29/423* (2006.01)

(52) U.S. Cl.
CPC ..... *H01L 29/78696* (2013.01); *H01L 27/1218* (2013.01); *H01L 27/1237* (2013.01); *H01L 27/1259* (2013.01); *H01L 29/4175* (2013.01); *H01L 29/41733* (2013.01); *H01L 29/42384* (2013.01); *H01L 29/66742* (2013.01); *H01L 29/66765* (2013.01); *H01L 29/78603* (2013.01); *H01L 29/78606* (2013.01)

(58) Field of Classification Search
CPC ................... H01L 29/78696; H01L 29/4175; H01L 29/66765; H01L 29/78606; H01L 27/1218; H01L 27/1237; H01L 27/1259
See application file for complete search history.

(56) References Cited

U.S. PATENT DOCUMENTS

2008/0277721 A1 11/2008 Lo et al.
2014/0339548 A1* 11/2014 Yamazaki ........... H01L 29/7869
257/43

FOREIGN PATENT DOCUMENTS

CN 101162325 4/2008
CN 101552277 10/2009

OTHER PUBLICATIONS

Office action from Chinese Application No. 201410213599.7 dated Apr. 6, 2016.

* cited by examiner

*Primary Examiner* — Whitney T Moore
(74) *Attorney, Agent, or Firm* — Calfee, Halter & Griswold LLP

(57) ABSTRACT

A thin film transistor, an array substrate, a method of fabricating the same, and a display device are provided. The thin film transistor includes a substrate plate, and an active layer, a source, and a drain which are arranged on the substrate plate. The thin film transistor also includes an inclined portion which is arranged on the substrate plate in an inclined manner. The active layer is at least partially arranged on the inclined portion. The source and the drain are arranged over the active layer and at least partially overlap the active layer. In this manner, the size of the thin film transistor in a direction parallel with the substrate plate can be effectively reduced.

11 Claims, 6 Drawing Sheets

THIN FILM TRANSISTOR, ARRAY SUBSTRATE, METHOD OF FABRICATING SAME, AND DISPLAY DEVICE

RELATED APPLICATIONS

The present application claims the benefit of Chinese Patent Application No. 201410213599.7, filed May 20, 2014, the entire disclosure of which is incorporated herein by reference.

FIELD

The present disclosure relates to the field of display technology, and particularly to a thin film transistor, an array substrate, a method of fabricating the same, and a display device.

BACKGROUND

A liquid crystal display (LCD) is a flat and ultra-thin display device. Liquid crystal display technology has become widely adopted, which has given rise to an increased demand on the performance of liquid crystal displays. The main performance index for liquid crystal display includes resolution and aperture ratio. A technique for improving resolution and aperture ratio is to reduce the size of an opaque region in the liquid crystal display.

A liquid crystal display generally includes an array substrate and a color film substrate. The array substrate includes a substrate plate, and components like a thin film transistor, gate lines, data lines, and pixel electrodes which are arranged on the substrate plate. The color film substrate comprises a black matrix, a color filtering layer, or the like. Regions in which the thin film transistor, the gate lines, and the data lines on the array substrate, as well as the black matrix on the color film substrate, are located are opaque regions. Since the black matrix is primarily used for shielding the thin film transistor, the gate lines, the data lines, and the like, the region where the black matrix is located overlaps the regions where the thin film transistor, the gate lines, and the data lines are located. Therefore, the size of the thin film transistor, the gate lines, and the data lines to a large extent determines the resolution and the aperture ratio of the liquid crystal display.

In the conventional liquid crystal display, the size of the thin film transistor in a direction parallel with the substrate plate is relatively large, so that the size of the opaque region in the liquid crystal display is also relatively large, which is not favorable for improving the resolution and aperture ratio of the liquid crystal display.

SUMMARY

The present disclosure provides a thin film transistor, an array substrate, a method of fabricating the same, and a display device. The exemplary embodiments of the present disclosure may at least alleviate one or more drawbacks of conventional liquid crystal displays. For example, the exemplary embodiments of the present disclosure may facilitate improvement of a resolution and aperture ratio of a liquid crystal display.

In an exemplary aspect of the present disclosure, a thin film transistor comprises a substrate plate, with an active layer, a source, and a drain arranged on the substrate plate. The thin film transistor further comprises an inclined portion arranged on the substrate plate in an inclined manner, wherein the active layer is at least partially arranged on the inclined portion, and wherein the source and the drain are arranged over the active layer and at least partially overlap the active layer.

The inclined portion can comprise a first inclined unit and a second inclined unit. The thin film transistor can further comprise a horizontal portion which is parallel with the substrate plate, an end of the horizontal portion being connected with the first inclined unit, the other end of the horizontal portion being connected with the second inclined unit, and the first and second inclined units are inclined in a direction away from the horizontal portion and the substrate plate.

The thin film transistor can further comprise a gate and a gate insulating layer which are successively arranged over the substrate plate and below the active layer. The active layer comprises a first active layer portion which is arranged on the horizontal portion, and a second active layer portion and a third active layer portion which extend from two ends of the first active layer portion and are arranged on the first and second inclined units respectively. The source at least partially overlaps the second active layer portion, and the drain at least partially overlaps the third active layer portion.

The source can comprise a first source portion on the first inclined unit and a second source portion which extends from the first source portion and is parallel with the substrate plate, with the first source portion at least partially overlapping the second active layer portion. The drain can comprise a first drain portion which is arranged on the second inclined unit, and a second drain portion which extends from the first drain portion and is parallel with the substrate plate, wherein the first drain portion at least partially overlaps the third active layer portion.

The gate can comprise a first gate portion which is parallel with the substrate plate, and the projection of the active layer in a direction perpendicular to the substrate plate completely falls within that of the first gate portion. Or, the gate can comprise a first gate portion which is arranged on the horizontal portion, and a second gate portion and a third gate portion which extend from two ends of the first gate portion and are arranged on the first and second inclined units, respectively.

The thin film transistor can further comprise a conductive gate extension layer on the gate. The gate extension layer comprises a first gate extension layer portion which is arranged on the horizontal portion, and a second gate extension layer portion and a third gate extension layer portion which extend from two ends of the first gate extension layer portion and are arranged on the first and second inclined units, respectively.

The present disclosure provides a thin film transistor comprising a substrate plate, with an active layer, a source, and a drain arranged on the substrate plate. The thin film transistor further comprises an inclined portion which is arranged on the substrate plate in an inclined manner. The active layer is at least partially arranged on the inclined portion. The source and the drain are arranged over the active layer and at least partially overlap the active layer. According to the present disclosure, the size of the thin film transistor in a direction parallel with the substrate plate can be effectively reduced, which, in turn, effectively reduces the size of the opaque region in the liquid crystal display, thus facilitating improvement in the resolution and aperture ratio of the liquid crystal display.

The present disclosure further provides an array substrate comprising a thin film transistor, wherein the thin film transistor comprises a substrate plate, with an active layer, a source, and a drain arranged on the substrate plate, wherein the thin film transistor further comprises an inclined portion which is arranged on the substrate plate in an inclined manner. The active layer is at least partially arranged on the inclined portion. The source and the drain are arranged over the active layer and at least partially overlap the active layer.

The array substrate can further comprise a first insulating layer, the first insulating layer being provided with an opening. The opening has a top portion and a bottom portion with a smaller size than the top portion. Opposing inclined sidewalls of the opening form a first inclined unit and a second inclined unit of the inclined portion, respectively.

The array substrate can further comprise a second insulating layer on the active layer, the source, and the drain, wherein the second insulating layer is provided with a via-hole corresponding to the drain. The second insulating layer can be made of, for example, at least one of silicon oxides and silicon nitrides.

The array substrate can further comprise a third insulating layer which is arranged between the second insulating layer and the active layer, the source, and the drain. The third insulating layer can be made of an insulating resin.

The present disclosure provides an array substrate which is provided with a thin film transistor. The thin film transistor comprises a substrate plate, with an active layer, a source, and a drain arranged on the substrate plate, wherein the thin film transistor further comprises an inclined portion which is arranged on the substrate plate in an inclined manner. The active layer is at least partially arranged on the inclined portion. The source and the drain are arranged over the active layer and at least partially overlap the active layer.

According to the present disclosure, the size of the thin film transistor in a direction parallel with the substrate plate can be reduced, which, in turn, reduces the size of an opaque region on the array substrate, thus facilitating improvement of the resolution and aperture ratio of a liquid crystal display.

The present disclosure further provides a display device comprising the above-mentioned array substrate.

Further, the present disclosure further provides a method of fabricating a thin film transistor, the method comprising forming a pattern comprising a gate on a substrate plate; on the substrate plate on which the pattern comprising the gate has been formed, forming a gate insulating layer; on the substrate plate on which the gate insulating layer has been formed, forming an inclined portion which is arranged on the substrate plate in an inclined manner; on the substrate plate on which the inclined portion has been formed, forming a pattern comprising an active layer, wherein the pattern of the active layer is at least partially arranged on the inclined portion; and on the substrate plate on which the pattern comprising the active layer has been formed, forming a pattern comprising a source and a drain to form the thin film transistor, wherein the pattern comprising the source and the drain is arranged over the active layer and at least partially overlaps the active layer.

The method can further comprise, before the step of forming the inclined portion, forming a horizontal portion which is parallel with the substrate plate; wherein the step of forming the inclined portion comprises forming a first inclined unit and a second inclined unit, an end of the horizontal portion being connected with the first inclined unit and the other end being connected with the second inclined unit; wherein the active layer comprises a first active layer portion which is arranged on the horizontal portion, and a second active layer portion and a third active layer portion which extend from two ends of the first active layer portion and are arranged on the first and second inclined units respectively; and wherein the source at least partially overlaps the second active layer portion, and the drain at least partially overlaps the third active layer portion.

The step of forming the source can comprise forming a first source portion which is arranged on the first inclined unit and a second source portion which extends from the first source portion and is parallel with the substrate plate, the first source portion at least partially overlapping the second active layer portion. Besides, the step of forming the drain can comprise forming a first drain portion which is arranged on the second inclined unit and a second drain portion which extends from the first drain portion and is parallel with the substrate plate, the first drain portion at least partially overlapping the third active layer portion.

The step of forming the gate can comprise only forming a first gate portion which is parallel with the substrate plate, wherein the projection of the active layer in a direction perpendicular to the substrate plate completely falls within that of the first gate portion. Alternatively, the step of forming the gate can comprise forming a first gate portion which is arranged on the horizontal portion, and a second gate portion and a third gate portion which extend from two ends of the first gate portion and are arranged on the first inclined portion and the second inclined portion, respectively.

When the gate is formed to only comprise the first gate portion which is parallel with the substrate plate, before the step of forming the gate insulating layer, the method can further comprise on the substrate plate on which the pattern comprising the gate has been formed, forming a conductive gate extension layer, wherein the gate extension layer comprises a first gate extension layer portion which is arranged on the horizontal portion, and a second gate extension layer portion and a third gate extension layer portion which extend from two ends of the first gate extension layer portion and are arranged on the first and second inclined units, respectively.

The present disclosure provides a method of fabricating a thin film transistor, the method comprising forming a pattern comprising a gate on a substrate plate; on the substrate plate on which the pattern comprising the gate has been formed, forming a gate insulating layer; on the substrate plate on which the gate insulating layer has been formed, forming an inclined portion which is arranged on the substrate plate in an inclined manner; on the substrate plate on which the inclined portion has been formed, forming a pattern comprising an active layer, wherein the pattern of the active layer is at least partially arranged on the inclined portion; and on the substrate plate on which the pattern comprising the active layer has been formed, forming a pattern comprising a source and a drain to form the thin film transistor, wherein the pattern comprising the source and the drain is arranged over the active layer and at least partially overlaps the active layer.

According to the present disclosure, the size of the thin film transistor in a direction parallel with the substrate plate can be reduced, which, in turn, reduces the size of an opaque region on the array substrate, thus facilitating improvement of the resolution and aperture ratio of a liquid crystal display.

The present disclosure further provides a method of fabricating an array substrate, the method comprising fabricating a thin film transistor on a substrate plate, wherein the method of fabricating the thin film transistor comprises forming a pattern comprising a gate on a substrate plate; on the substrate plate on which the pattern comprising the gate has been formed, forming a gate insulating layer; on the substrate plate on which the gate insulating layer has been formed, forming an inclined portion which is arranged on the substrate plate in an inclined manner; on the substrate plate on which the inclined portion has been formed, forming a pattern comprising an active layer, wherein the pattern of the active layer is at least partially arranged on the inclined portion; and on the substrate plate on which the pattern comprising the active layer has been formed, forming a pattern comprising a source and a drain to form the thin film transistor, wherein the pattern comprising the source and the drain is arranged over the active layer and at least partially overlaps the active layer.

The method of fabricating an array substrate can further comprise forming a first insulating layer on the substrate plate, and forming a pattern comprising an opening in the first insulating layer by a patterning process, the opening having a top portion and a bottom portion with a smaller size than the top portion, and opposing inclined sidewalls of the opening forming a first inclined unit and a second inclined unit of the inclined portion, respectively.

The method of fabricating an array substrate can further comprise forming a second insulating layer on the array substrate on which the first insulating layer and the thin film transistor have been formed, and forming a via-hole in the second insulating layer which corresponds to the drain by performing a patterning process. In an exemplary embodiment, the patterning process is performed one time. The second insulating layer can be made of, for example, silicon oxides or silicon nitrides.

After forming the first insulating layer and before forming the second insulating layer, the method can further comprise: forming a third insulating layer on the array substrate on which the thin film transistor and the first insulating layer have been formed. The third insulating layer can be made of an insulating resin.

The present disclosure provides a method of fabricating an array substrate, the method comprising fabricating a thin film transistor on a substrate plate, wherein the method of fabricating the thin film transistor comprises forming a pattern comprising a gate on a substrate plate; on the substrate plate on which the pattern comprising the gate has been formed, forming a gate insulating layer; on the substrate plate on which the gate insulating layer has been formed, forming an inclined portion which is arranged on the substrate plate in an inclined manner; on the substrate plate on which the inclined portion has been formed, forming a pattern comprising an active layer, wherein the pattern of the active layer is at least partially arranged on the inclined portion; and on the substrate plate on which the pattern comprising the active layer has been formed, forming a pattern comprising a source and a drain to form the thin film transistor, wherein the pattern comprising the source and the drain is arranged over the active layer and at least partially overlaps the active layer.

According to the present disclosure, the size of the thin film transistor in a direction parallel with the substrate plate can be reduced, which, in turn, reduces the size of an opaque region on the array substrate, thus facilitating improvement of the resolution and aperture ratio of a liquid crystal display.

BRIEF DESCRIPTION OF THE DRAWINGS

Several technical aspects of the present disclosure will be described in more detail below with reference to the accompanying drawings in order for those skilled in the art to be able to carry out the present disclosure. The present disclosure may, however, be embodied in many different fours and should not be construed as limited to the exemplary embodiments set forth herein. In particular, the general inventive concepts are not intended to be limited by the various illustrative embodiments disclosed herein.

DETAILED DESCRIPTION

Figure 1:
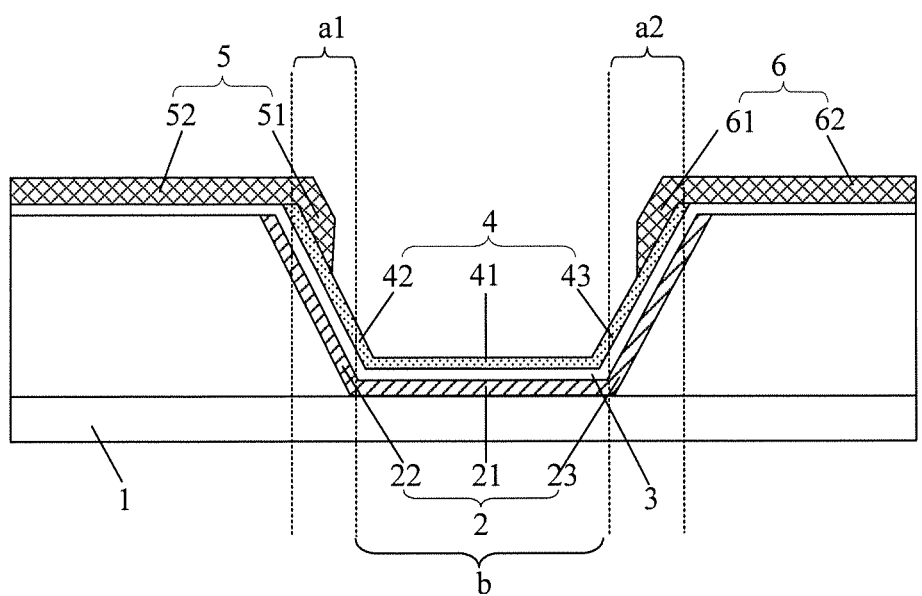
FIG. 1 is a schematic view illustrating a first thin film transistor, according to an exemplary embodiment.

The present invention and associated general inventive concepts will be further described hereinafter in detail with reference to the accompanying drawings and various exemplary embodiments. One of ordinary skill in the art will appreciate that these exemplary embodiments only constitute a fraction of the possible embodiments encompassed by the present invention and associated general inventive concepts. As such, the scope of the present disclosure is by no means limited to the exemplary embodiments set forth herein.

Reference numerals in the accompanying drawings are explained as follow: 1-substrate plate, 2-gate, 21-first gate portion, 22-second gate portion, 23-third gate portion, 3-gate insulating layer, 4-active layer, 41-first active layer portion, 42-second active layer portion, 43-third active layer portion, 5-source, 51-first source portion, 52-second source portion, 6-drain, 61-first drain portion, 62-second drain portion, 7-gate extension layer, 8-first insulating layer, 81-opening, 9-second insulating layer, 91-via-hole, 10-third insulating layer, a-inclined portion, a1-first inclined unit, a2-second inclined unit, and b-horizontal portion.

In a first exemplary embodiment of the present disclosure, a thin film transistor comprises a substrate plate and an inclined portion arranged on the substrate plate, wherein the thin film transistor has a relatively small size in a direction parallel with the substrate plate. As compared with a convention thin film transistor, the magnitude by which the size of the thin film transistor has been decreased can be easily derived from the inclining angle of the inclined portion.

The inclined portion in the thin film transistor can be an integral part. The inclined portion in the thin film transistor can comprise a plurality of inclined units. The inclined units can be connected either directly or via another mechanism. The inclined units can have the same inclining angle or have different inclining angles.

As shown in FIGS. 1, 2, 3, and 4, a thin film transistor, according to the first exemplary embodiment, comprises an active layer 4, a source 5, and a drain 6. The active layer 4 is at least partially arranged on the inclined portion. The source 5 and the drain 6 are arranged over the active layer 4, and at least partially overlap the active layer 4. According to the present disclosure, the active layer of the thin film transistor is at least arranged on the inclined portion, so as to effectively reduce the size in a direction parallel with the substrate plate 1. In this manner, the size of an opaque region in the liquid crystal display is reduced, thus facilitating improvement of the resolution and aperture ratio of the liquid crystal display.

Figure 2:
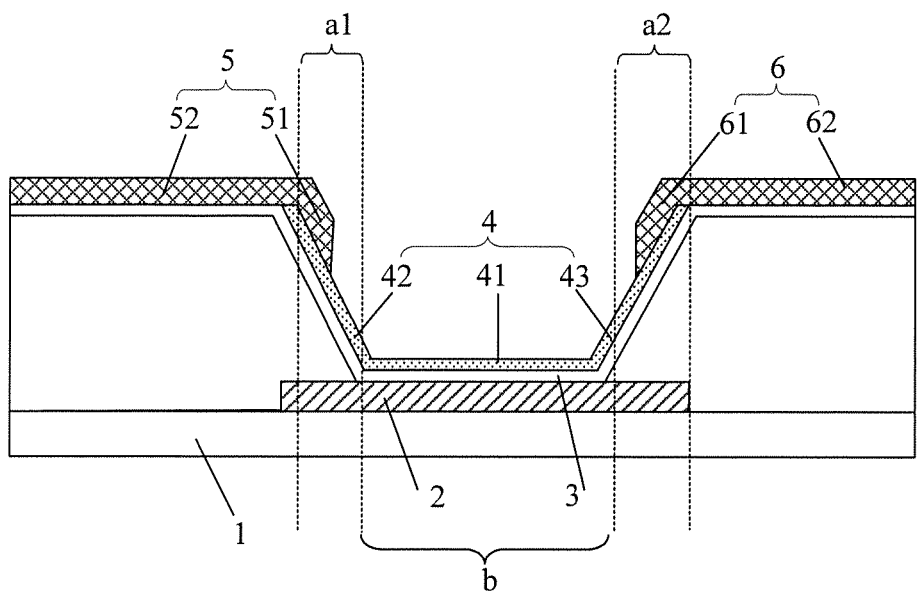
FIG. 2 is a schematic view illustrating a second thin film transistor, according to an exemplary embodiment
Figure 3:
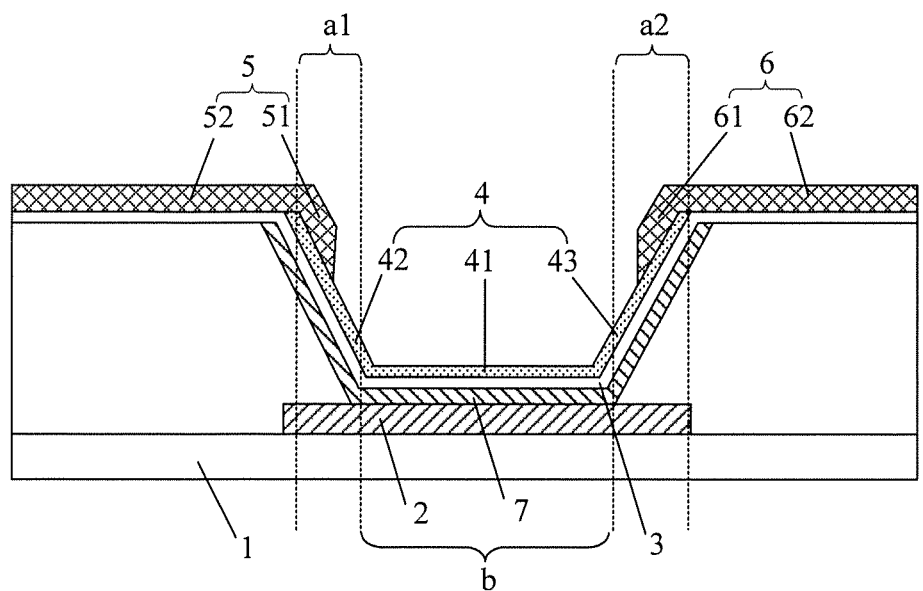
FIG. 3 is a schematic view illustrating a third thin film transistor, according to an exemplary embodiment.

With reference to FIGS. 1, 2, and 3, an inclined portion a of the thin film transistor comprises a first inclined unit a1 and a second inclined unit a2. The thin film transistor further comprises a horizontal portion b which is parallel with the substrate plate 1. An end of the horizontal portion b is connected with the first inclined unit a1, and the other end of the horizontal portion b is connected with the second inclined unit a2. The first inclined unit a1 and the second inclined unit a2 are inclined in a direction away from the horizontal portion b and the substrate plate 1. The angle between the first inclined unit a1 and the substrate plate 1 can be the same as the angle between the second inclined unit a2 and the substrate plate 1.

The thin film transistor can be a bottom gate type thin film transistor, and can also be a top gate type thin film transistor. The thin film transistor of the present disclosure is described using a bottom gate type thin film transistor as an example. In this case, the thin film transistor further comprises a gate 2, a gate insulating layer 3, an active layer 4, a source 5, and a drain 6, which are successively arranged over the substrate plate 1. The active layer 4 comprises a first active layer portion 41 on the horizontal portion b, and a second active layer portion 42 and a third active layer portion 43 which extend from two ends of the first active layer portion 41 and are arranged on the first inclined unit a1 and the second inclined unit a2, respectively. The source 5 is connected with the second active layer portion 42, i.e., the source 5 at least partially overlaps the second active layer portion 42. The drain 6 is connected with the third active layer portion 43, i.e., the drain 6 at least partially overlaps the third active layer portion 43. The source 5 can comprise a first source portion 51 arranged on the first inclined unit a1 and a second source portion 52 which extends from the first source portion 51 and is parallel with the substrate plate 1. The drain 6 can comprise a first drain portion 61 arranged on the second inclined unit a2 and a second drain portion 62 which extends from the first drain portion 61 and is parallel with the substrate plate 1.

Further, the gate insulating layer 3 can also comprise a first gate insulating layer portion arranged on the horizontal portion b, and a second gate insulating layer portion and a third gate insulating layer portion which extend from two ends of the first gate insulating layer portion and are arranged on the first inclined unit a1 and the second inclined unit a2, respectively.

The size of the thin film transistor in a direction parallel with the substrate plate 1 is primarily determined by the largest distance between the source 5 and the drain 6, and it is only required that the size of the gate 2 should be smaller than this size. Therefore, as for the above-described bottom gate type thin film transistor, as shown in FIG. 2, the gate 2 can only comprise a first gate portion 21 which is parallel with the substrate plate 1. In order to enable the gate 2 to effectively control turning-on and off of the thin film transistor, the projection of the active layer 4 in a direction perpendicular to the substrate plate 1 completely falls within that of the first gate portion 21. In this case, in order to further improve the turning-on and off performance of the thin film transistor, as shown in FIG. 3, the thin film transistor can further comprise a conductive gate extension layer 7 which is arranged on the gate 2. The gate extension layer 7 comprises a first gate extension layer portion arranged on the horizontal portion b, and a second gate extension layer portion and a third gate extension layer portion which extend from two ends of the first gate extension layer portion and are arranged on the first inclined unit a1 and the second inclined unit a2, respectively. In order to simplify the construction of thin film transistor, the construction shown in FIG. 1 can be adopted in the present disclosure. The gate 2 comprises the first gate portion 21 which is arranged on the horizontal portion b, and a second gate portion 22 and a third gate portion 23 which extend from two ends of the first gate portion 21 and are arranged on the first inclined unit a1 and the second inclined unit a2, respectively. In this case, the gate 2 and the active layer 4 have the corresponding constructions, so that the gate 2 can more effectively control turning-on and off of the thin film transistor.

The region where the gate 2, the gate insulating layer 3, and the active layer 4 are located can have a cross-section of circle, square, triangle, or any other regular pattern or irregular pattern.

The present disclosure provides a thin film transistor comprising a substrate plate and an inclined portion arranged on the substrate plate in an inclined manner. As a result, the size of the thin film transistor in a direction parallel with the substrate plate can be reduced, which, in turn, reduces the size of an opaque region in the liquid crystal display, thus facilitating improvement of the resolution and aperture ratio of the liquid crystal display.

In a second exemplary embodiment of the present disclosure, an array substrate comprises the thin film transistor of the first exemplary embodiment.

Figure 4:
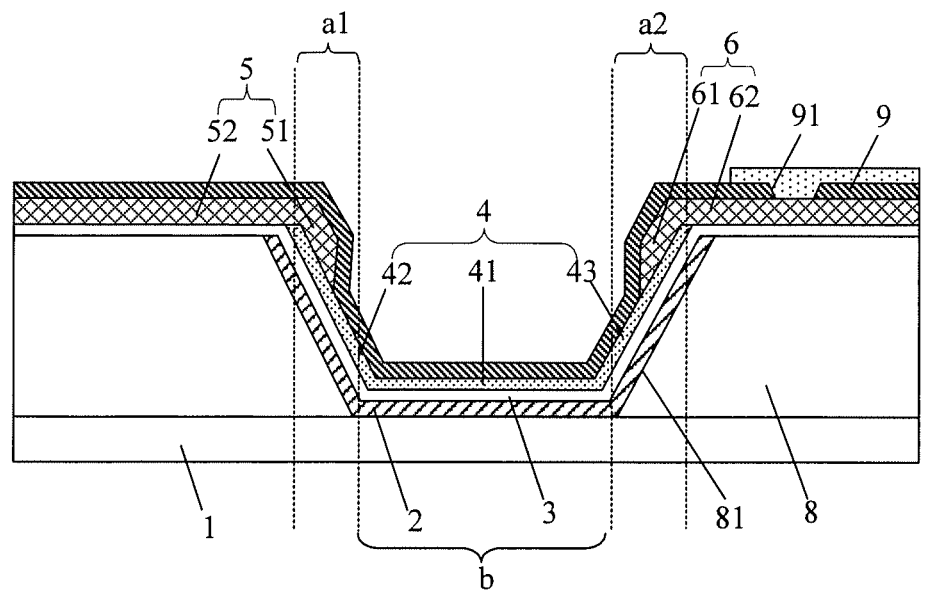
FIG. 4 is a schematic view illustrating a first array substrate, according to an exemplary embodiment.

As shown in FIG. 4, the array substrate can further comprise a first insulating layer 8 for supporting the thin film transistor. The first insulating layer 8 is provided with an opening 81. The opening 81 has a top portion and a bottom portion with a smaller size than the top portion. Inclined sidewalls of the opening 81 form the inclined portion a as mentioned above. For example, opposing inclined sidewalls of the opening 81 can form the first inclined unit a1 and the second inclined unit a2, respectively. Referring to FIG. 4 and the related description of the first exemplary embodiment, the active layer 4 is at least partially arranged on the first inclined unit a1 and the second inclined unit a2 formed by inclined sidewalls. The source 5 and the drain 6 are arranged over the active layer 4 and at least partially overlap the active layer 4. For example, as shown in FIG. 4, the gate 2, the gate insulating layer 3, the active layer 4, the first source portion 51, and the first drain portion 61 of the thin film transistor are located inside the opening 81, while the second source portion 52 and the second drain portion 62 are located outside the opening 81.

As noted above, the region where the gate 2, the gate insulating layer 3, and the active layer 4 are located can have a cross-section of circle, square, triangle, or any other regular or irregular pattern. Therefore, the opening 81 can also have a cross-section of circle, square, triangle, or other regular or irregular pattern.

As shown in FIG. 4, the array substrate can further comprise a second insulating layer 9 which is arranged on the active layer 4, the source 5, and the drain 6. The array substrate further comprises pixel electrodes (not shown) which are arranged on the second insulating layer 9, and the second insulating layer 9 is provided with a via-hole 91 corresponding to the drain 6, so that the pixel electrodes are electrically connected with the drain 6 through the via-hole 91.

Figure 5:
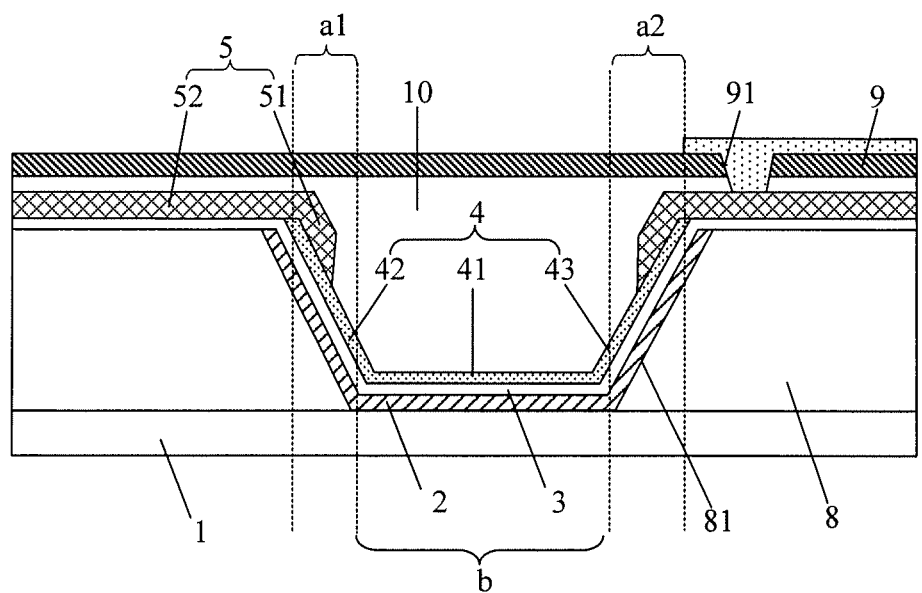
FIG. 5 is a schematic view illustrating a second array substrate, according to an exemplary embodiment.

The second insulating layer 9 can be made of, for example, silicon oxides or silicon nitrides. The second insulating layer 9 can be formed by any suitable process including, for example, plasma enhanced chemical vapor deposition or the like. The second insulating layer 9 formed on different positions of the array substrate has the same thickness, which is generally not favorable for flatness of the array substrate. Therefore, in order to make the whole array substrate more flat, as shown in FIG. 5, the array substrate further comprises a third insulating layer 10 which is arranged between the second insulating layer 9 and the active layer 4, the source 5, and the drain 6. The third insulating layer 10 can be made of insulating resin, and can be formed by spinning, coating, or the like. As a result, the third insulating layer 10 formed on different positions of the array substrate has different thickness, so that the whole array substrate can be more flat.

Furthermore, in the case that the third insulating layer 10 is an insulating resin, adhesion between the third insulating layer 10 and the pixel electrodes of ITO is not solid, such that pixel electrodes tend to fall off, leading to defects. Therefore, in the present disclosure, there is typically not provided an array substrate in which only the third insulating layer 10 is provided while the second insulating layer 9 is not provided.

The array substrate of the present disclosure is provided with a thin film transistor, and the thin film transistor comprises a substrate plate and an inclined portion arranged on the substrate plate in an inclined manner. As a result, the size of the thin film transistor in a direction parallel with the substrate plate can be reduced, which, in turn, reduces the size of an opaque region on the array substrate, thus facilitating improvement of the resolution and aperture ratio of a liquid crystal display.

The present disclosure further provides a display device which comprises the above-mentioned array substrate. The display device can be any product or component with a display function, for example, a liquid crystal panel, an electronic paper, an organic light emitting diode panel, a mobile phone, a tablet computer, a TV, a monitor, a notebook computer, a digital photo frame, and a GPS navigator, and the like.

Figure 6:
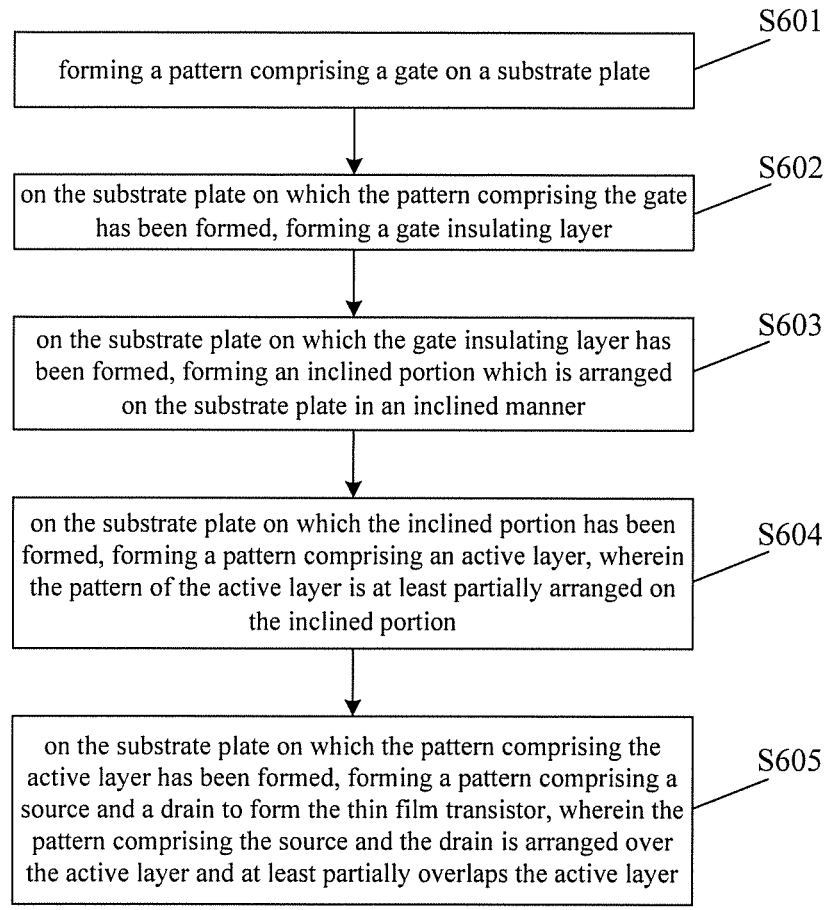
FIG. 6 is a flow chart illustrating a method of fabricating a thin film transistor, according to an exemplary embodiment.

In a third exemplary embodiment of the present disclosure, a method of fabricating a thin film transistor is provided. As shown in FIG. 6, the method of fabricating a thin film transistor comprises steps S601, S602, S603, S604, and S605.

In step S601, a pattern comprising a gate is formed on a substrate plate by any suitable process.

For example, a gate metal layer is formed on the substrate plate 1 by sputtering. Then, photoresist is coated on the formed gate metal layer. Then, a mask plate comprising a pattern of the gate 2 is used for shielding. Lastly, through processes like exposure, development, etching, and stripping of photoresist, a pattern comprising the gate 2 is formed on the substrate plate 1.

The formed the gate 2 can comprise the first gate portion 21 arranged on the horizontal portion b, and the second gate portion 22 and the third gate portion 23 which extend from two ends of the first gate portion 21 and are arranged on the first inclined portion a1 and the second inclined portion a2 respectively. The formed gate 2 can also only comprise the first gate portion 21 which is parallel with the substrate plate 1, so that the projection of the subsequently-formed active layer 4 in a direction perpendicular to the substrate plate 1 completely falls within that of the first gate portion 21.

In case that formed the gate 2 only comprises the first gate portion 21 which is parallel with the substrate plate 1, the method can further comprise the following step to ensure the thin film transistor has excellent turning-on and off performance. Particularly, before forming the gate insulating layer 3, the method further comprises forming a conductive gate extension layer 7 on the substrate plate 1 on which the pattern comprising the gate 2 has been formed, wherein the gate extension layer 7 has a construction corresponding to that of the active layer 4, and comprises a first gate extension layer portion arranged on the horizontal portion b, and a second gate extension layer portion and a third gate extension layer portion which extend from two ends of the first gate extension layer portion and are arranged on the first inclined portion a1 and the second inclined portion a2, respectively.

In step S602, a gate insulating layer is formed on the substrate plate on which the pattern comprising the gate has been formed.

For example, using laser enhanced chemical vapor deposition, the gate insulating layer 3 is formed on the substrate plate 1 on which the pattern comprising the gate 2 has been formed.

In step S603, on the substrate plate on which the gate insulating layer has been formed, an inclined portion arranged on the substrate plate in an inclined manner is formed.

In step S604, on the substrate plate on which the inclined portion has been formed, a pattern comprising an active layer is formed, wherein the pattern of the active layer is at least partially arranged on the inclined portion.

For example, on the substrate plate 1 on which the gate insulating layer 3 has been formed, a semiconductor layer is formed by sputtering. Then, photoresist is coated on the formed semiconductor layer. Then, a mask plate comprising a pattern of the active layer 4 is used for shielding. Lastly, through processes like exposure, development, etching, and stripping of photoresist, on the substrate plate 1 on which the gate insulating layer 3 has been formed, a pattern comprising the active layer 4 is formed. The pattern of active layer 4 is at least partially arranged on inclined portion a. For example, the active layer 4 comprises the first active layer portion 41 arranged on the horizontal portion b, and the second active layer portion 42 and the third active layer portion 43 which extend from two ends of the first active layer portion 41 and are arranged on the first inclined unit a1 and the second inclined unit a2, respectively. The second active layer portion 42 and the third active layer portion 43 are at least partially arranged on the first inclined unit a1 and the second inclined unit a2, respectively.

In step S605, on the substrate plate on which the pattern comprising the active layer has been formed, a pattern comprising a source and a drain is formed, thus forming a thin film transistor.

For example, on the substrate plate 1 on which the pattern comprising the active layer 4 has been formed, a source/drain metal layer is formed by sputtering. Then, photoresist is coated on the formed source/drain metal layer. Then, a mask plate comprising a pattern of the source 5 and the drain 6 is used for shielding. Lastly, through processes like exposure, development, etching, and stripping of photoresist, on the substrate plate 1 on which the patterning comprising the active layer 4 has been formed, a pattern comprising the source 5 and the drain 6 is formed, thus forming a thin film transistor. The source 5 is connected with the second active layer portion 42, and the drain 6 is connected with the third active layer portion 43. The source 5 comprises the first source portion 51 which is arranged on the first inclined unit a1, and the second source portion 52 which extends from the first source portion 51 and is parallel with the substrate plate 1. The drain 6 comprises the first drain portion 61 arranged on the second inclined unit a2, and the second drain portion 62 which extends from the first drain portion 61 and is parallel with the substrate plate 1.

The present disclosure provides a method of fabricating a thin film transistor, comprising successively forming a gate, a gate insulating layer, an active layer, a source, and a drain on a substrate plate. The active layer, the source, and the drain comprise a portion which is parallel with the substrate plate and a portion which is inclined. As a result, the size of the thin film transistor in a direction parallel with the substrate plate can be reduced, which, in turn, reduces the size of an opaque region on the array substrate, thus facilitating improvement of the resolution and aperture ratio of a liquid crystal display.

In a fourth exemplary embodiment of the present disclosure, a method of fabricating an array substrate is provided. The method comprises the method of fabricating a thin film transistor according to the third exemplary embodiment.

The method of fabricating an array substrate can further comprise forming the first insulating layer 8, and forming a pattern comprising the opening 81 in the first insulating layer 8 by a patterning process, wherein the opening 81 has a top portion and a bottom portion with a smaller size than the top portion. The gate 2, the gate insulating layer 3, the active layer 4, the first source portion 51, and the first drain portion 61 of the thin film transistor are located inside the opening 81. The second source portion 52 and the second drain portion 62 are located outside the opening 81.

It is noted that during fabrication of the array substrate, the gate 2 of the thin film transistor can be firstly formed on the substrate plate 1, the first insulating layer 8 is then formed, the first insulating layer 8 is subject to etching to form the opening 81, and then other components of the thin film transistor are formed. It is also possible to form the first insulating layer 8 on the substrate plate 1, the first insulating layer 8 is subject to a patterning process to form the opening 81, and then other components of the thin film transistor, like the gate 2, the gate insulating layer 3, the active layer 4, the source 5, and the drain 6, are formed.

The method of fabricating an array substrate can further comprise forming the second insulating layer 9 on the array substrate on which the thin film transistor and the first insulating layer 8 have been formed; and the forming the via-hole 91 corresponding to the drain 6 in the second insulating layer 9 by performing a patterning process. In an exemplary embodiment, the patterning process is performed one time. In an exemplary embodiment, the second insulating layer 9 is made of silicon oxides or silicon nitrides.

In order to improve flatness of the array substrate, the method of fabricating an array substrate further comprises, before forming the second insulating layer 9 on the array substrate on which the thin film transistor and the first insulating layer 8 have been formed, forming the third insulating layer 10 on the array substrate on which the thin film transistor and the first insulating layer 8 have been formed, wherein the third insulating layer 10 can be made of insulating resin.

It is noted that the method of fabricating an array substrate can further comprise other steps, like a step for fabricating pixel electrodes.

The present disclosure provides a method of fabricating an array substrate, comprising forming a thin film transistor, wherein the thin film transistor comprises a substrate plate, a gate, a gate insulating layer, an active layer, a source, and a drain which are arranged on the substrate plate successively, wherein the active layer, the source, and the drain comprise a portion which is parallel with the substrate plate and a portion which is arranged in an inclined manner. The size of the thin film transistor in a direction parallel with the substrate plate can be reduced, which, in turn, reduces the size of an opaque region on the array substrate, thus facilitating improvement of the resolution and aperture ratio of a liquid crystal display.

Although the present disclosure has been described with reference to specific embodiments, it should be understood that the limitations of the described embodiments are provided merely for purpose of illustration and are not intended to limit the present invention and associated general inventive concepts. Instead, the scope of the present invention is defined by the appended claims, and all variations and equivalents that fall within the range of the claims are intended to be embraced therein. Thus, other embodiments than the specific exemplary ones described herein are equally possible within the scope of these appended claims.

The invention claimed is:

1. A thin film transistor comprising a substrate plate;
an active layer, a source, and a drain arranged on the substrate plate;
an inclined portion arranged on the substrate plate, the inclined portion comprising a first inclined unit and a second inclined unit; and
a horizontal portion substantially parallel to the substrate plate, the horizontal portion comprising a first end connected with the first inclined unit, and a second end connected with the second inclined unit;
wherein the active layer comprises:
a first active layer portion arranged on the horizontal portion;
a second active layer portion extending from a first end of the first active layer portion and arranged on the first inclined unit; and
a third active layer portion extending from a second end of the first active layer portion and arranged on the second inclined unit;
wherein the first active layer portion, the second active layer portion, and the third active layer portion are conformally arranged on the horizontal portion, the first inclined unit, and the second inclined unit, respectively, so that the active layer is recessed with respect to the surface of the thin film transistor;
wherein the source and the drain are arranged over the active layer and at least partially overlap the active layer; and
wherein the first and second inclined units are inclined in a direction away from the horizontal portion and the substrate plate.

2. The thin film transistor of claim 1, further comprising:
a gate and a gate insulating layer which are successively arranged over the substrate plate and below the active layer;
wherein the source at least partially overlaps the second active layer portion, and the drain at least partially overlaps the third active layer portion.

3. The thin film transistor of claim 2, wherein:
the source comprises a first source portion which is arranged on the first inclined unit and a second source portion which extends from the first source portion and is parallel with the substrate plate, the first source portion at least partially overlapping the second active layer portion; and
the drain comprises a first drain portion which is arranged on the second inclined unit and a second drain portion which extends from the first drain portion and is parallel with the substrate plate, the first drain portion at least partially overlapping the third active layer portion.

4. The thin film transistor of claim 3, wherein the gate comprises a first gate portion substantially parallel to the substrate plate, and wherein the projection of the active layer in a direction perpendicular to the substrate plate completely falls within that of the first gate portion.

5. The thin film transistor of claim 4, further comprising:
a conductive gate extension layer arranged on the gate;
wherein the conductive gate extension layer comprises a first gate extension layer portion which is arranged on the horizontal portion, and a second gate extension layer portion and a third gate extension layer portion which extend from two ends of the first gate extension layer portion and are arranged on the first and second inclined units, respectively.

6. The thin film transistor of claim 3, wherein the gate comprises a first gate portion which is arranged on the horizontal portion, and a second gate portion and a third gate portion which extend from two ends of the first gate portion and are arranged on the first and second inclined units, respectively.

7. An array substrate comprising a thin film transistor, wherein the thin film transistor comprises:
a substrate plate;
an active layer, a source, and a drain which are arranged on the substrate plate; and
an inclined portion which is arranged on the substrate plate, the inclined portion comprising a first inclined unit and a second inclined unit; and
a horizontal portion substantially parallel to the substrate plate, the horizontal portion comprising a first end connected with the first inclined unit, and a second end connected with the second inclined unit;
wherein the active layer comprises:
a first active layer portion arranged on the horizontal portion;
a second active layer portion extending from a first end of the first active layer portion and arranged on the first inclined unit; and
a third active layer portion extending from a second end of the first active layer portion and arranged on the second inclined unit;
wherein the first active layer portion, the second active layer portion, and the third active layer portion are conformally arranged on the horizontal portion, the first inclined unit, and the second inclined unit, respectively, so that the active layer is recessed with respect to the surface of the thin film transistor;
wherein the source and the drain are arranged over the active layer and at least partially overlap the active layer; and
wherein the first and second inclined units are inclined in a direction away from the horizontal portion and the substrate plate.

8. The array substrate of claim 7, further comprising a first insulating layer which is arranged on the substrate plate, the first insulating having an opening,
wherein the opening has a top portion and a bottom portion with a smaller size than the top portion, and
wherein opposing inclined sidewalls of the opening form a first inclined unit and a second inclined unit of the inclined portion respectively.

9. The array substrate of claim 8, further comprising a second insulating layer which is arranged on the active layer, the source, and the drain, wherein the second insulating layer is provided with a via-hole which corresponds to the drain.

10. The array substrate of claim 9, further comprising a third insulating layer which is arranged between the second insulating layer and the active layer, the source, and the drain.

11. A display device, comprising:
a frame; and
an array substrate comprising:
a substrate plate;
an active layer, a source, and a drain which are arranged on the substrate plate; and
an inclined portion which is arranged on the substrate plate, the inclined portion comprising a first inclined unit and a second inclined unit; and
a horizontal portion substantially parallel to the substrate plate, the horizontal portion comprising a first end connected with the first inclined unit, and a second end connected with the second inclined unit;
wherein the active layer comprises:
a first active layer portion arranged on the horizontal portion;
a second active layer portion extending from a first end of the first active layer portion and arranged on the first inclined unit; and
a third active layer portion extending from a second end of the first active layer portion and arranged on the second inclined unit;
wherein the first active layer portion, the second active layer portion, and the third active layer portion are conformally arranged on the horizontal portion, the first inclined unit, and the second inclined unit, respectively, so that the active layer is recessed with respect to the surface of the thin film transistor;
wherein the source and the drain are arranged over the active layer and at least partially overlap the active layer; and
wherein the first and second inclined units are inclined in a direction away from the horizontal portion and the substrate plate.

* * * * *